(12) United States Patent
Lee et al.

(10) Patent No.: US 9,570,556 B1
(45) Date of Patent: Feb. 14, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wei-Yang Lee, Taipei (TW); Feng-Cheng Yang, Hsinchu County (TW); Ting-Yeh Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/060,270

(22) Filed: Mar. 3, 2016

(51) Int. Cl.
*H01L 31/0328* (2006.01)
*H01L 31/0336* (2006.01)
*H01L 31/072* (2012.01)
*H01L 31/109* (2006.01)
*H01L 29/08* (2006.01)
*H01L 29/24* (2006.01)
*H01L 29/267* (2006.01)
*H01L 29/66* (2006.01)
*H01L 29/78* (2006.01)

(52) U.S. Cl.
CPC ........... *H01L 29/0847* (2013.01); *H01L 29/24* (2013.01); *H01L 29/267* (2013.01); *H01L 29/665* (2013.01); *H01L 29/66795* (2013.01); *H01L 29/7848* (2013.01); *H01L 29/7851* (2013.01)

(58) Field of Classification Search
CPC ............. H01L 29/785; H01L 29/66795; H01L 21/823431; H01L 27/0886; H01L 29/7851; H01L 21/823821; H01L 29/7848; H01L 29/7845; H01L 29/267; H01L 29/665; H01L 29/0856; H01L 29/0873; H01L 29/24; H01L 29/0847
USPC .................. 438/283, 300, 164; 257/192, 722
See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Thien F Tran
(74) *Attorney, Agent, or Firm* — McDermott Will & Emery LLP

(57) ABSTRACT

A semiconductor device includes an isolation layer disposed over a substrate, first and second fin structures, a gate structure, a source/drain structure. The first fin structure and the second fin structure are both disposed over the substrate, and extend in a first direction in plan view. The gate structure is disposed over parts of the first and second fin structures, and extends in a second direction crossing the first direction in plan view. A first void is formed in the source/drain structure, and a second void is formed in the source/drain structure and located above the first void.

20 Claims, 9 Drawing Sheets

(56) References Cited

U.S. PATENT DOCUMENTS

| | | | |
|---|---|---|---|
| 8,823,065 B2 | 9/2014 | Wang et al. | |
| 8,860,148 B2 | 10/2014 | Hu et al. | |
| 9,105,490 B2 | 8/2015 | Wang et al. | |
| 9,397,008 B1* | 7/2016 | Tung | H01L 21/82343 |
| 2011/0147828 A1* | 6/2011 | Murthy | H01L 21/02057 |
| | | | 257/327 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0225065 A1* | 8/2014 | Rachmady | H01L 29/42392 |
| | | | 257/24 |

* cited by examiner

US 9,570,556 B1

SEMICONDUCTOR DEVICE AND MANUFACTURING METHOD THEREOF

TECHNICAL FIELD

The disclosure relates to a semiconductor integrated circuit, and more particularly to a semiconductor device having an epitaxial source/drain (S/D) structure with voids and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
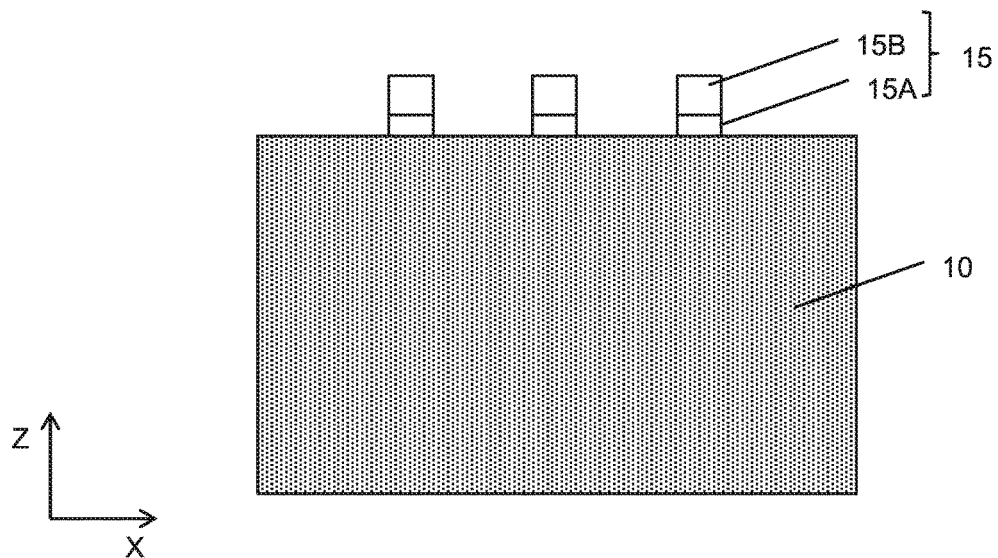
FIGS. 1-12 show exemplary cross sectional views of various stages for manufacturing a Fin FET device according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1-12 show exemplary cross sectional views of various stages for manufacturing a Fin FET device according to one embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

A mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Figure 2:
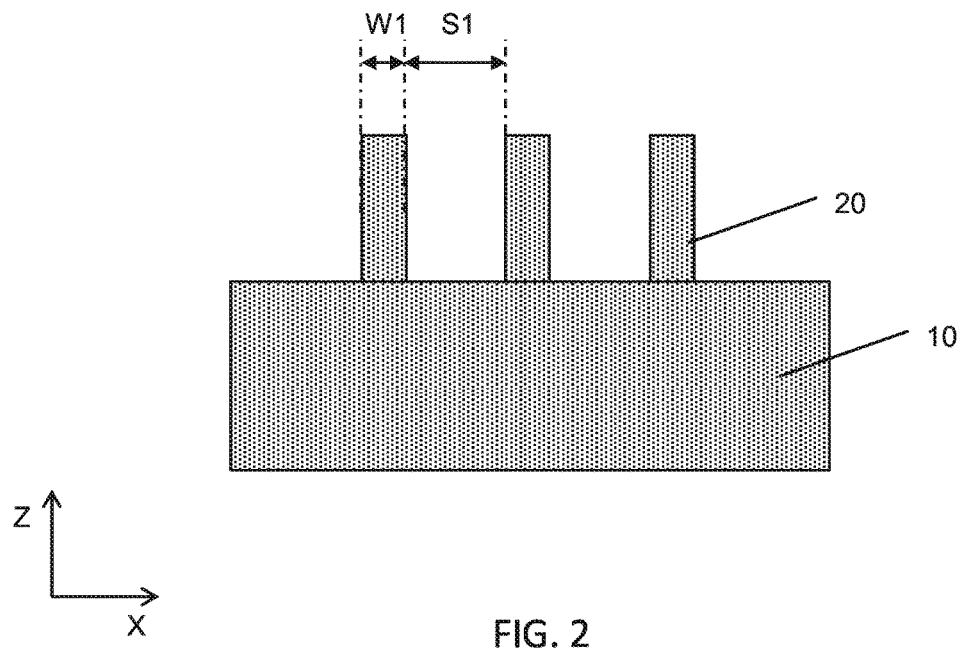

Then, as shown in FIG. 2, by using the hard mask pattern 15 as an etching mask, the substrate 10 is patterned into fin structures 20 by trench etching using a dry etching method and/or a wet etching method.

In FIG. 2, three fin structures 20 are disposed over the substrate 10. However, the number of the fin structures is not limited to three. The numbers may be as small as one or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two fin structures is in a range from about 5 nm to about 40 nm in some embodiments, and is in a range from about 8 nm to about 15 nm in other embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 3:
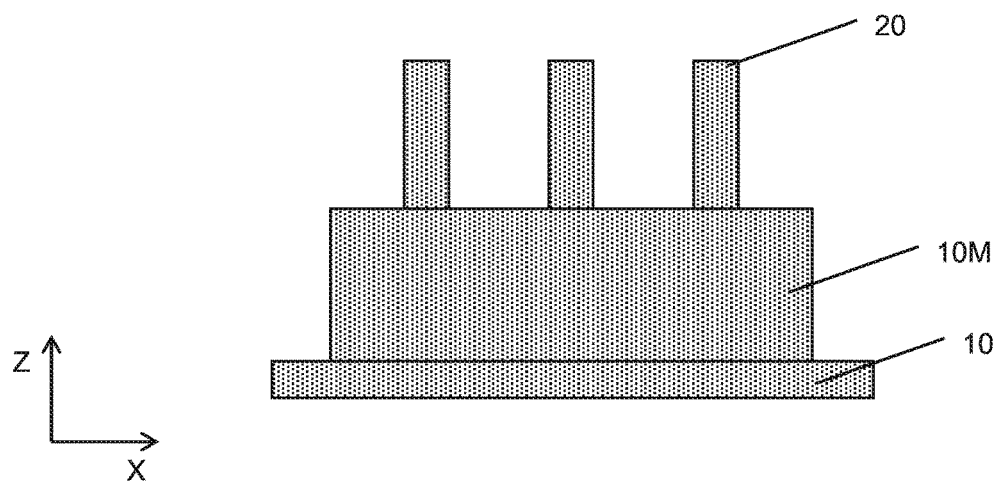

After the fin structures 20 are formed, the substrate 10 is further etched to form a mesa shape 10M, as shown in FIG. 3. In other embodiments, the mesa shape 10M is first formed, and then the fin structures 20 are formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
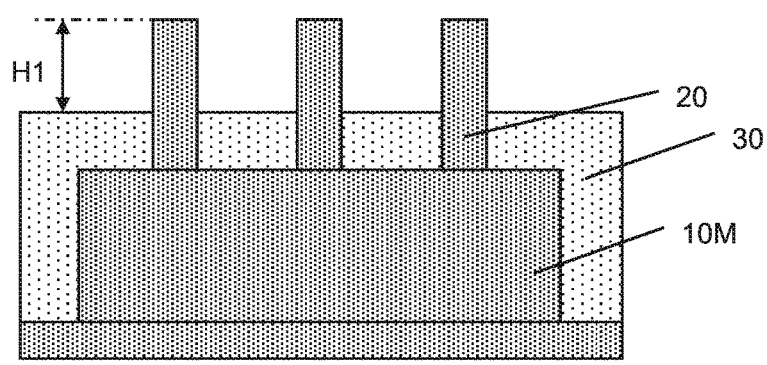

The insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
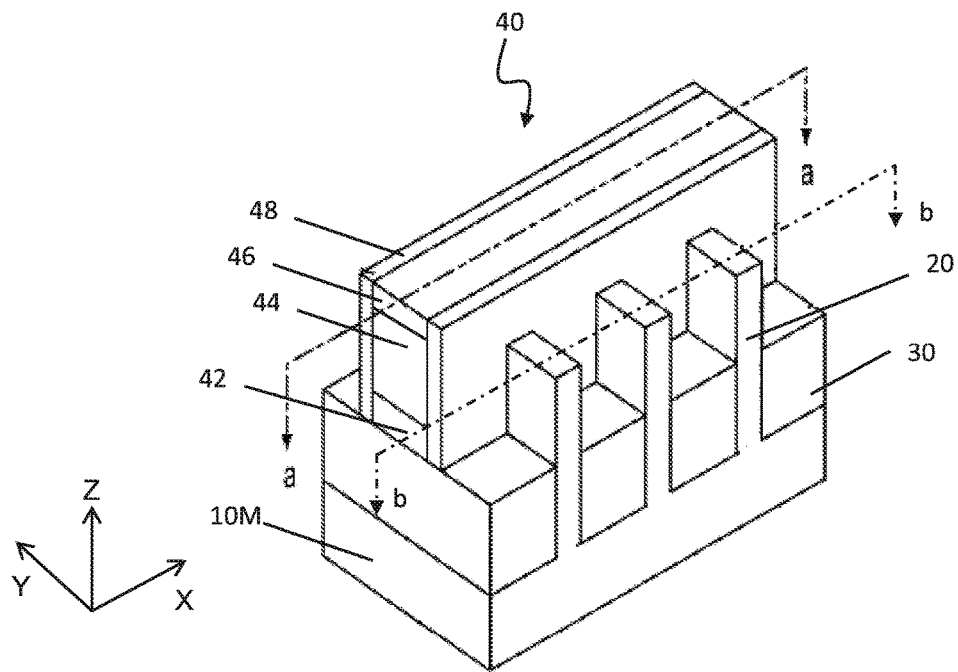
Figure 5B:
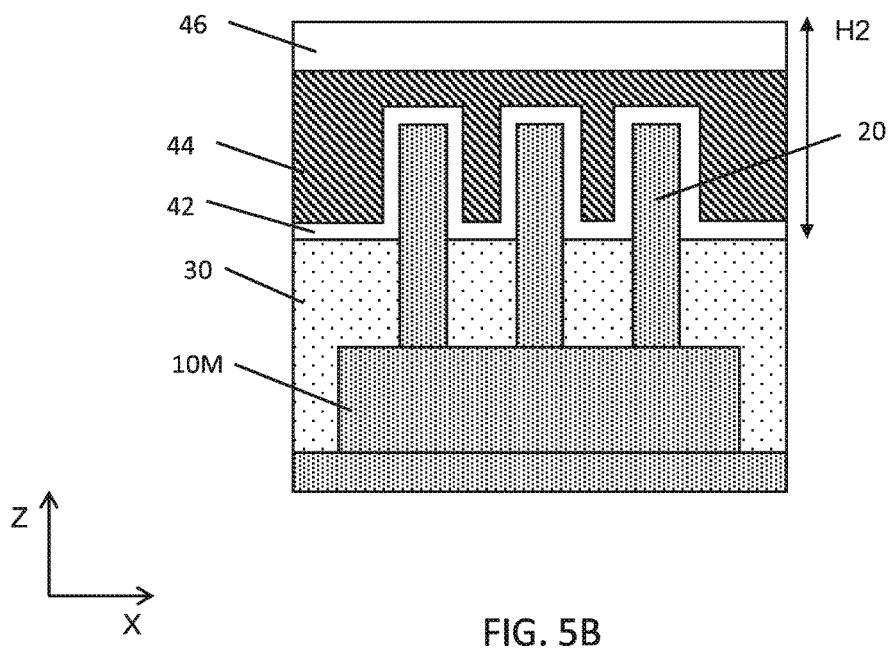
Figure 5C:
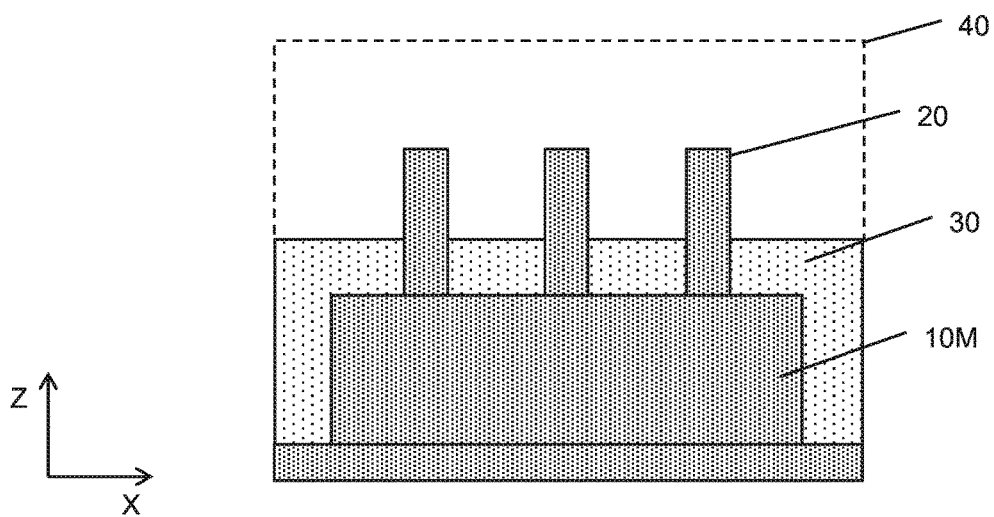

After the insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6-14 are also exemplary cross sectional views along line b-b of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. In some embodiments, a height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 6:
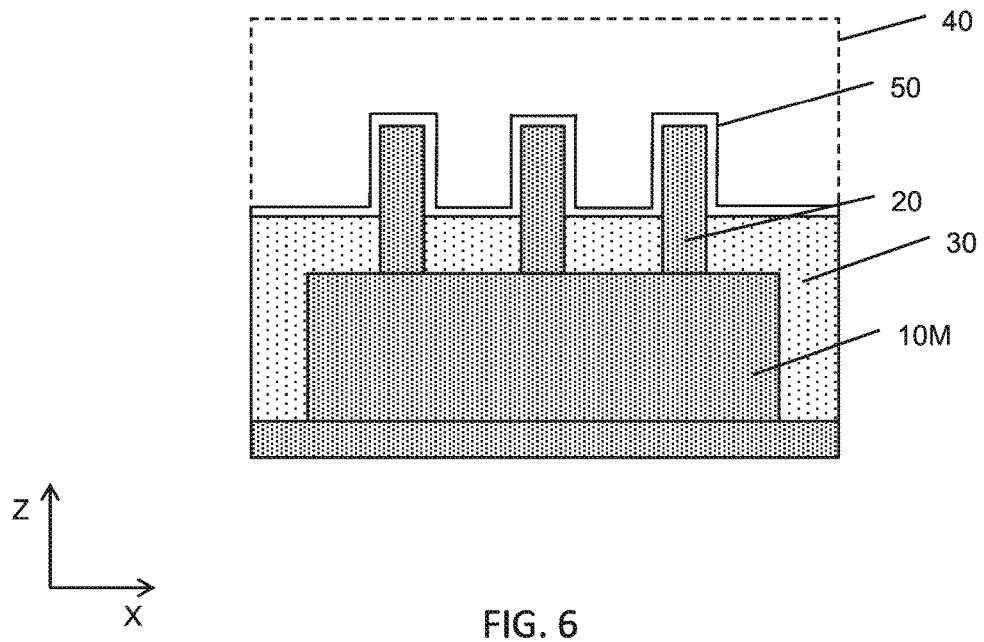

Then, as shown in FIG. 6, a protective layer 50 is formed over the fin structures 20 in p-type device regions. The protective layer 50 is made of dielectric material including silicon nitride based material, such as SiN, SiON, SiOCN or SiCN. In one embodiment, SiN is used as the protective layer 50. The protective layer 50 is formed by CVD, PVD, ALD, e-beam evaporation, or other suitable process. The protective layer 50 may also be formed on side faces of the gate structure. The protective layer 50 protects the p-type device regions during the subsequent epitaxial source/drain formation for n-type FETs. The thickness of the protective layer 50 is in a range from about 5 nm to about 12 nm in some embodiments.

After forming a blanket layer of the protective layer 50, the protective layer 50 in the n-type device regions is removed for the source/drain formation for the n-type Fin FETs.

Figure 7:
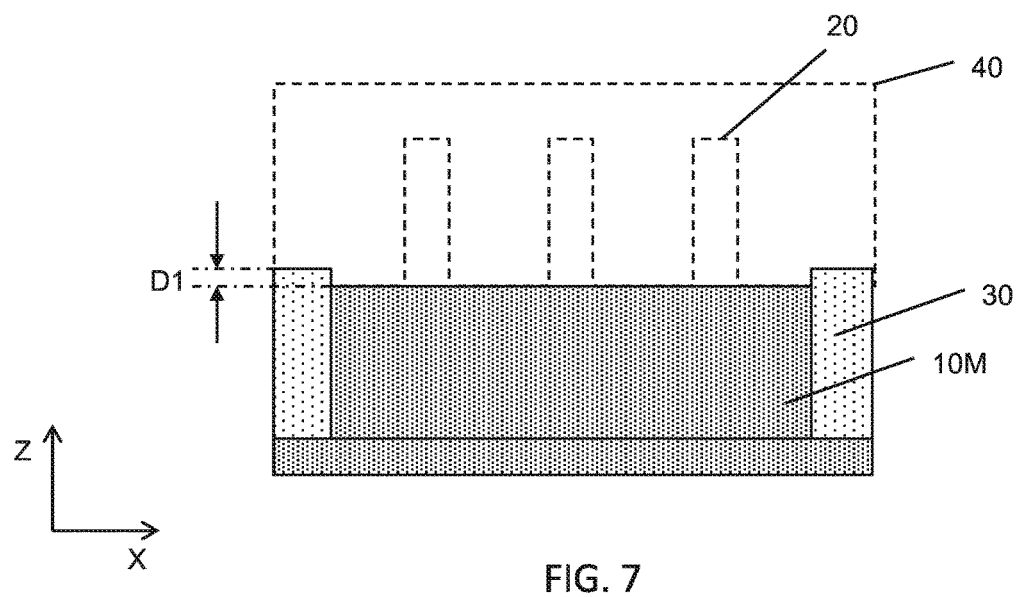

Then, the upper portion of the fin structures 20 are recessed and the protective layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the isolation insulating layer 30, as shown in FIG. 7. In the recessing the first and second fin structures, the isolation insulating layer 30 between and adjacent to the first and second fin structures are removed. The first and second fin structures are recessed to bottoms of the first and second fin structures so that a recessed portion of the first and second fin structures have a substantially flat surface (surface roughness Ra is less than about 3 nm). The depth D1 of the recessed fin structures from the upper surface of the isolation insulating layer 30 is in a range from about 40 nm to about 70 nm in some embodiments.

Figure 8:
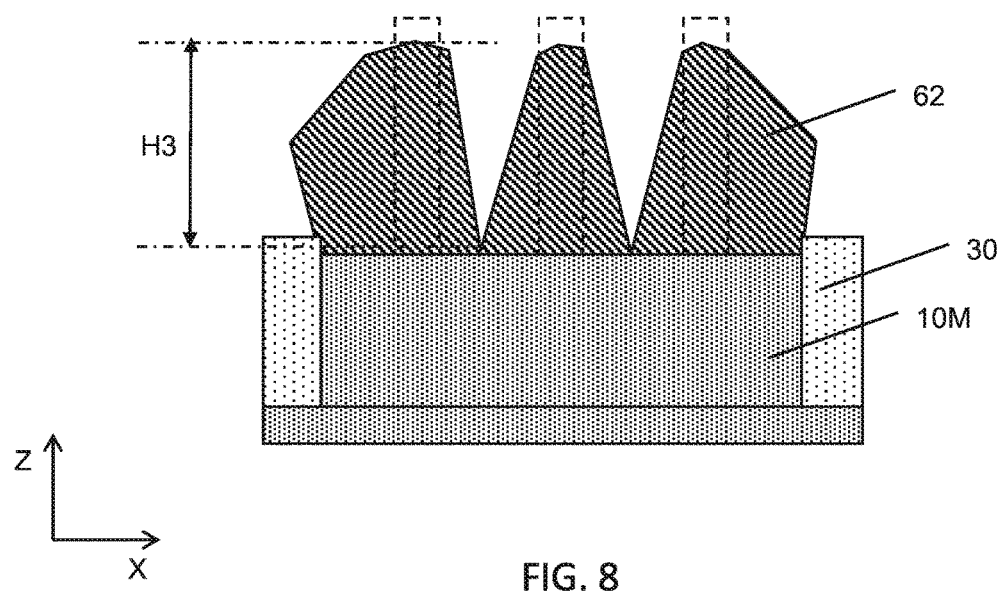

Then, as shown in FIG. 8, a first epitaxial layer 62 is formed over the recessed fin structures 20. The first epitaxial layer 62 is made of one or more layers of semiconductor material having a different lattice constant than the fin structures 20 (channel regions). When the fin structures are made of Si, the epitaxial layer 62 includes SiP, SiC or SiCP for n-channel Fin FETs. The first epitaxial layer 62 is epitaxially formed over the upper portions of the recessed fin structures.

In some embodiments, the first epitaxial layer 62 is SiP. The amount of P is in a range from about $1\times10^{20}$ $cm^{-3}$ to about $1\times10^{21}$ $cm^{-3}$ in some embodiments, and is in a range from about $5\times10^{20}$ $cm^{-3}$ to about $8\times10^{20}$ $cm^{-3}$ in some embodiments.

In some embodiments, the SiP first epitaxial layer 62 is grown at a temperature of about 700 to 850° C. under a pressure of about 5 to 50 Torr, by using a Si containing gas such as $SiH_4$, $Si_2H_6$ or $SiCl_2H_2$; HCl; and/or a dopant gas, such as $PH_3$. Under these conditions, the SiP first epitaxial layer 62 can be formed to have a V-shape as shown in FIG. 8, while the side faces of the SiP first epitaxial layer 62 has a diamond-like shape. In one embodiment, a cycle epitaxial deposition process is used to form the V-shape. In the cycle epitaxial deposition process, an epitaxial growth of a Si layer and an etching-back process of the Si layer are alternately repeated. By adjusting a ratio of the deposition and the etching, a V-shape epitaxial layer can be obtained.

The height of the first epitaxial layer 62 from the bottom of the "valley" of the V-shape is in a range from about 10 nm to about 40 nm in some embodiments, and is in a range from about 15 nm to about 30 nm in other embodiments.

Figure 9:
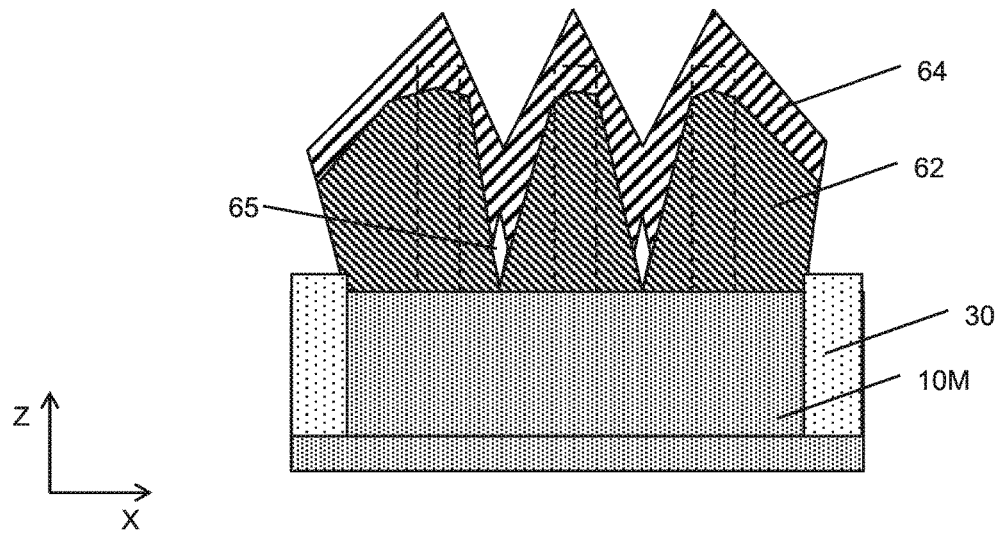

Next, as shown in FIG. 9, a second epitaxial layer 64 is formed over the first epitaxial layer 62. The second epitaxial layer 64 is made of one or more layers of semiconductor material having a different lattice constant than the fin structures 20 (channel regions). When the fin structures are made of Si, the second layer 64 includes SiP, SiC or SiCP for n-channel Fin FETs. The second epitaxial layer 64 is epitaxially formed over the first epitaxial layer 62.

In some embodiments, the second epitaxial layer 64 is SiP, where the amount of P is greater than the amount of P in the first epitaxial layer 62. The amount of P in the second epitaxial layer 64 is in a range from about $1\times10^{21}$ $cm^{-3}$ to about $5\times10^{21}$ $cm^{-3}$ in some embodiments, and is equal to or less than about $2\times10^{21}$ $cm^{-3}$ in some embodiments.

In some embodiments, the SiP second epitaxial layer 64 is grown at a temperature of about 700 to 850° C. under a pressure of about 5 to 50 Torr, by using a Si containing gas such as $SiH_4$, $Si_2H_6$ or $SiCl_2H_2$; HCl; and/or a dopant gas, such as $PH_3$. Under these conditions, the SiP second epitaxial layer 64 can be formed to have a V-shape as shown in FIG. 9. Similar to the first epitaxial layer, a cycle deposition process can be employed.

Figure 10:
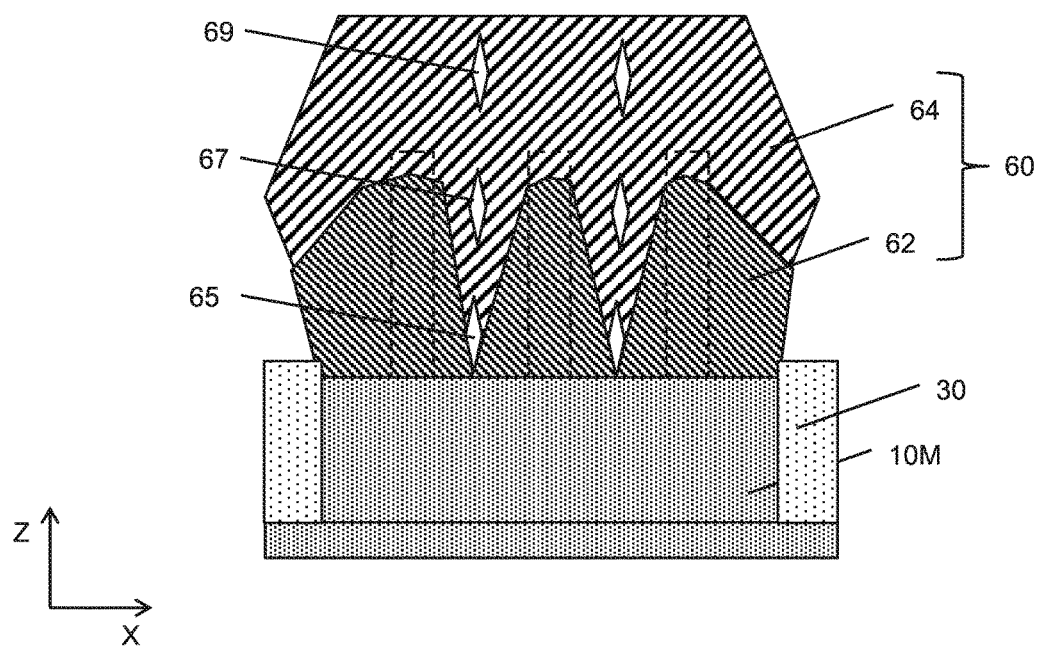

Further, as shown in FIG. 9, a first void 65 is formed between the first and second epitaxial layers at the "valley" of the first epitaxial layer 62. Since the source gases for the second epitaxial layer do not reach the bottom of the valley, the first voids 65 are formed in the bottom of the valley. By continuing the epitaxial grown of the second epitaxial layer 64, the entire source/drain structure 60 is formed as shown in FIG. 10. In some embodiments, the first void 65 is formed in the second epitaxial layer slightly above the bottom of the valley of the first epitaxial layer 62.

Further, as shown in FIG. 9, multiple first voids 65 are formed. The heights (the highest point) of the multiple first voids 65 are substantially the same (the variation of the heights is ±5% of the average height).

As shown in FIG. 10, the second voids 67 are formed in the second epitaxial layer 64, which are located above the first voids 65. In some embodiments, the third voids 69 are formed in the second epitaxial layer 64, which are located above the second voids 67 and the first voids 65. One or more series of voids (e.g., fourth, fifth, sixth, . . . ) located at different heights above the third voids may be formed, due to a crystal orientation of the epitaxial grown layer. Further, as shown in FIG. 10, multiple second voids 67 and/or multiple third voids 69 are formed. The heights (the highest point) of the multiple second voids 67 are substantially the same (the variation of the heights is ±5% of the average height), and the heights (the highest point) of the multiple third voids 69 are substantially the same (the variation of the heights is ±5% of the average height).

The dimension of the voids 65, 67 or 69 along the Z direction is in a range from about 1 nm to about 7 nm in some embodiments, and in a range from about 2 nm to about 5 nm in other embodiments.

After the source/drain structures for n-channel FETs are formed, source/drain structures for p-channel FETs are formed by separate epitaxial processes. When the fin structures are made of Si, the first and/or second epitaxial layers are made of SiGe or Ge for p-channel Fin FETs. In some embodiments, after the source/drain structures for p-channel FETs are formed, the source/drain structures for n-channel FETs are formed by separate epitaxial processes.

Figure 11:
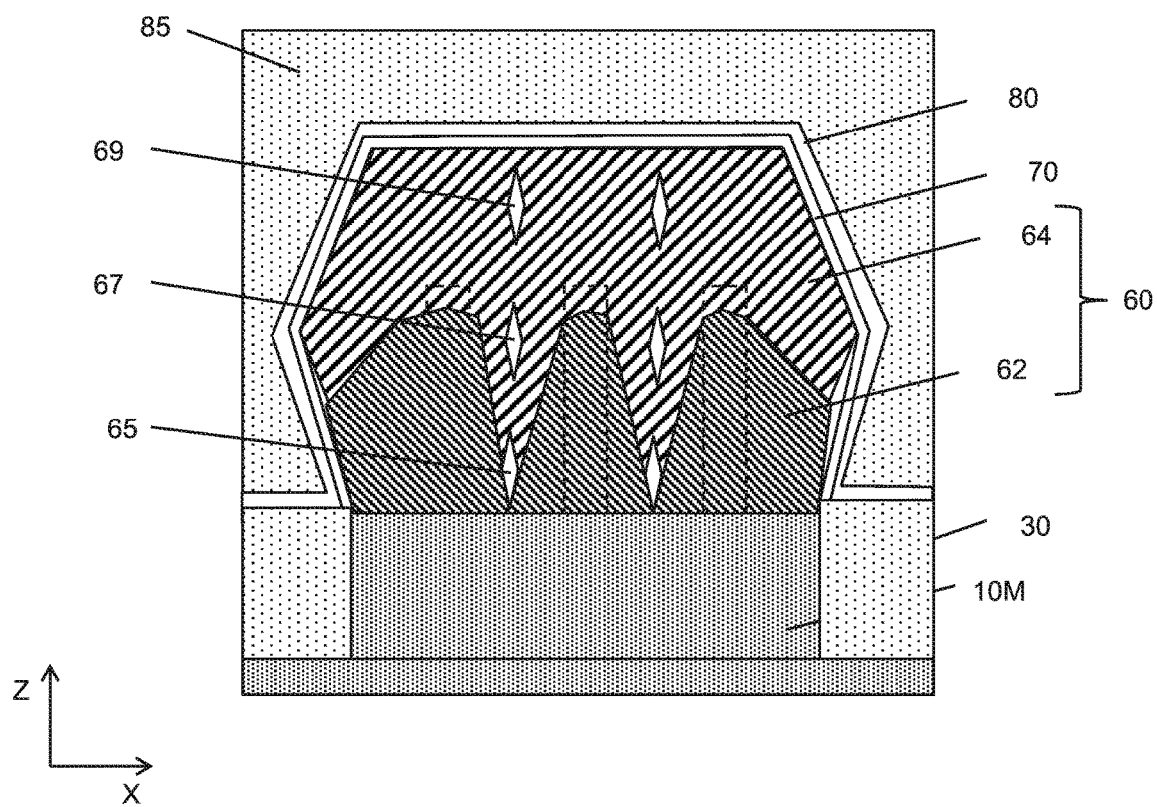

After the epitaxial source/drain structure 60 is formed, as shown in FIG. 11, a silicide layer 70 is formed over the epitaxial source/drain structure 60.

A metal material, such as Ni, Ti, Ta and/or W, is formed over the epitaxial source/drain structure 60, and an annealing operation is performed to form a silicide layer 70. In other embodiments, a silicide material, such as NiSi, TiSi, TaSi and/or WSi, is formed over the epitaxial source/drain structure 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments. Before or after the annealing operations, the metal material or the silicide material formed over the isolation insulating layer 30 is selectively removed.

Then, a metal gate structure (not shown) is formed. After forming the silicide layer 70, the dummy gate structures (dummy gate electrode 44 and dummy gate dielectric layer 42) are removed and replaced with a metal gate structures (metal gate electrode and gate dielectric layer).

In certain embodiments, a first interlayer dielectric layer is formed over the dummy gate structures and a planarization operation, such as a chemical mechanical polishing (CMP) process or an etch-back process, is performed to expose the upper surface of the dummy gate electrode 44. Then, the dummy gate electrode 44 and the dummy gate dielectric layer 42 are removed, by appropriate etching processes, respectively, to form a gate opening. Metal gate structures including a gate dielectric layer and metal gate electrode are formed in the gate openings.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations such as a CMP are performed.

Then, as shown in FIG. 11, an insulating layer 80, functions as a contact etching stop layer, is formed over the formed metal gate structure and the source/drain structures 60, and then the second interlayer dielectric layer 85 is formed. The insulating layer 80 is one or more layers of insulating material. In one embodiment, the insulating layer 80 is made of silicon nitride formed by CVD.

By using a patterning operation including lithography, a contact hole is formed in the second interlayer dielectric layer 85 and the insulating layer 80 so as to expose the epitaxial source and drain structures 60 with the silicide layer 70.

Figure 12:
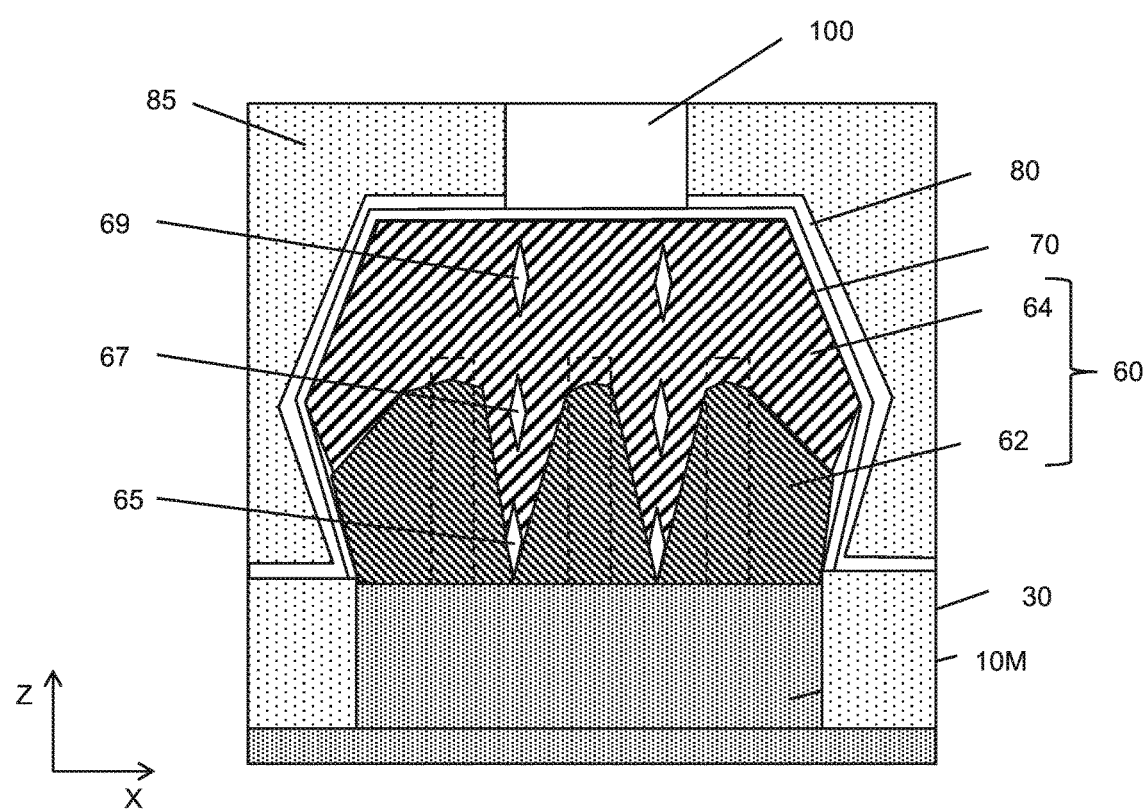

Then, the contact hole is filled with a conductive material, thereby forming a contact plug 100, as shown in FIG. 12. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layers, contacts/vias, interconnect metal layers, and passivation layers, etc.

In the alternative, the silicide layer 70 is formed after the contact hole is opened. In such a case, after forming the epitaxial source/drain structure 60 as shown in FIG. 10, the metal gate structures, the insulating layer 80 (contact etching stop layer) and the interlayer dielectric layer 85 are formed, without forming a silicide layer. Then, a contact hole is formed in the insulating layer 80 and the interlayer dielectric layer 85 to expose the upper surface of the epitaxial source/drain structure 60, and then a silicide layer is formed on the upper surface of the epitaxial source/drain structure 60. After forming the silicide layer, the conductive material is formed in the contact hole, thereby forming a contact plug 100.

Figure 13:
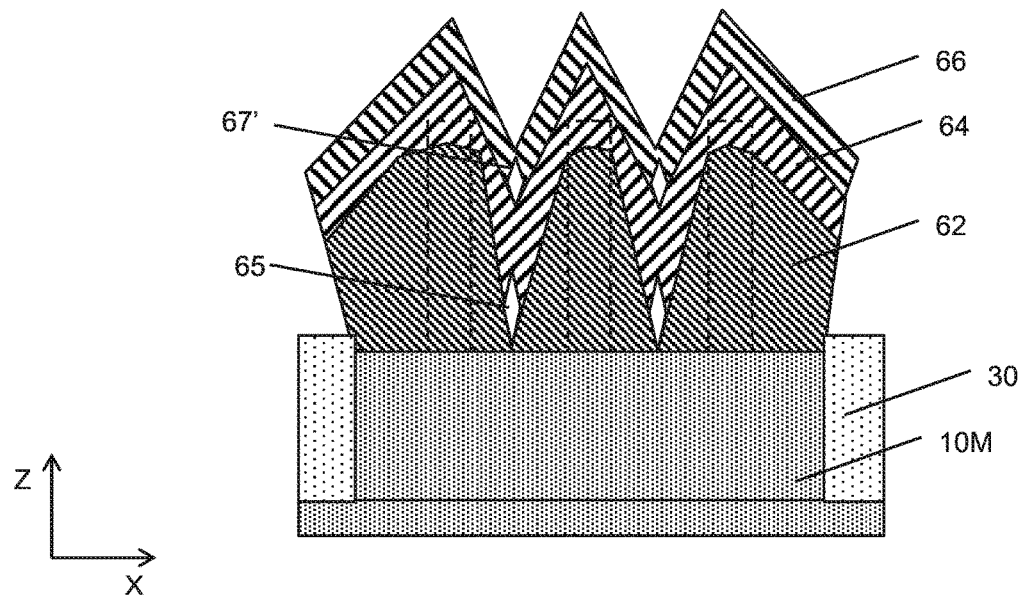
FIGS. 13 and 14 show exemplary cross sectional views of various stages for manufacturing a Fin FET device according to another embodiment of the present disclosure
Figure 14:
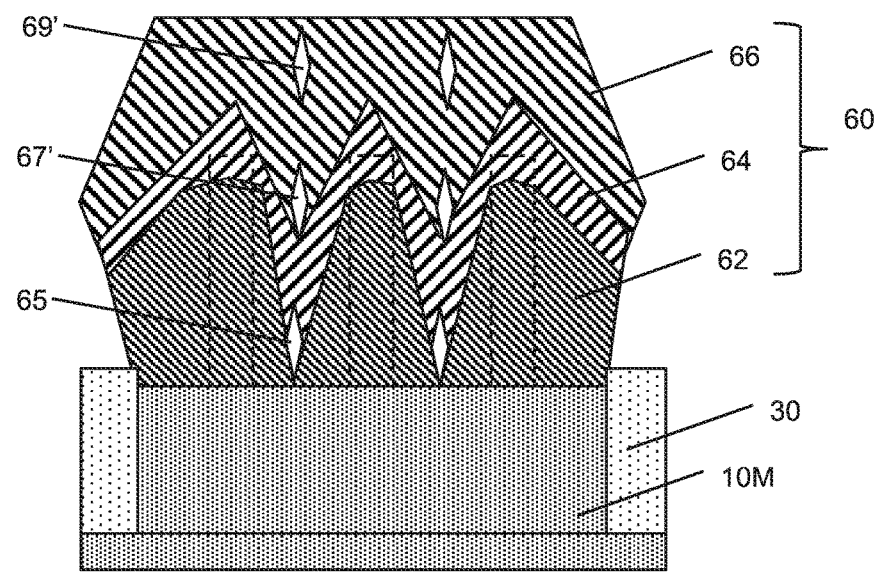

FIGS. 13 and 14 show exemplary cross sectional views of various stages for manufacturing a Fin FET device according to another embodiment of the present disclosure.

After the second epitaxial layer 64 is formed as shown in FIG. 9, a third epitaxial layer 66 is formed over the second epitaxial layer 64 as shown in FIG. 13. By continuing the formation of the third epitaxial layer 66, the entire epitaxial source/drain structure 60' is formed as shown in FIG. 14.

In some embodiments, the third epitaxial layer 66 is SiP, where the amount of P is equal to or greater than the amount of P in the second epitaxial layer 64. The amount of P in the third epitaxial layer 66 is in a range from about $1 \times 10^{21}$ cm$^{-3}$ to about $8 \times 10^{21}$ cm$^{-3}$ in some embodiments, and is equal to or less than about $5 \times 10^{21}$ cm$^{-3}$ in some embodiments.

In some embodiments, the SiP third epitaxial layer 66 is grown at a temperature of about 700 to 850° C. under a pressure of about 5 to 50 Torr, by using a Si containing gas such as $SiH_4$, $Si_2H_6$ or $SiCl_2H_2$; HCl; and/or a dopant gas, such as $PH_3$. Under these conditions, the SiP second epitaxial layer 64 can be formed to have a V-shape as shown in FIG. 13.

Further, as shown in FIG. 13, a second void 67' is formed between the third and second epitaxial layers at the "valley" of the first, second and third epitaxial layers. Moreover, as shown in FIG. 14, the third voids 69' are formed in the third epitaxial layer 64, which are located above the second voids 67'. One or more series of voids (e.g., fourth, fifth, sixth, . . . ) located at different heights above the third voids may be formed.

The dimension of the voids 65, 67' or 69' along the Z direction is in a range from about 1 nm to about 7 nm in some embodiments, and in a range from about 2 nm to about 5 nm in other embodiments.

In the present disclosure, since multiple voids are formed at different heights in the epitaxial source/drain structure, a parasitic capacitance at the source/drain structure can be reduced.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a first fin structure and a second fin structure are formed over a substrate. The first and second fin structures extending in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structures. The gate structure includes a gate pattern, a dielectric layer disposed between the gate pattern and the first and second fin structures, a cap insulating layer disposed over the gate pattern, and extends in a second direction crossing the first direction in plan view. Upper portions of the first and second fin structures are recessed to a level equal to or below an upper surface of the isolation insulating layer. A first epitaxial layer is formed over the recessed first and second fin structures. A second epitaxial layer is formed over the first epitaxial layer, thereby forming an epitaxial source/drain structure. In forming the first epitaxial layer, a V-shape structure is formed at an area corresponding to an area between the first and second fin structures that have been recessed. A first void is formed by the second epitaxial layer at a bottom of the V-shape.

In accordance with another aspect of the present disclosure, in a method of manufacturing a semiconductor device including a Fin FET, a first fin structure and a second fin structure are formed over a substrate. The first and second fin structures extend in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structures. The gate structure includes a gate pattern, a dielectric layer disposed between the gate pattern and the first and second fin structures, a cap insulating layer disposed over the gate pattern, and extends in a second direction crossing the first direction in plan view. Upper portions of the first and second fin structures are recessed to a level equal to or below an upper surface of the isolation insulating layer. A first epitaxial layer is formed over the recessed first and second fin structures. A second epitaxial layer is formed over the first epitaxial layer. A third epitaxial layer is formed over the second epitaxial layer, thereby forming an epitaxial source/drain structure. In forming the first epitaxial layer, a first V-shape structure is formed at an area corresponding to an area between the first and second fin structures that have been recessed. A first void is formed by the second epitaxial layer at a bottom of the first V-shape. In forming the second epitaxial layer, a second V-shape structure is formed over the first V-shape. A second void is formed by the third epitaxial layer at a bottom of the second V-shape.

In accordance with another aspect of the present disclosure, a semiconductor device includes an isolation insulating layer, a first fin structure and a second fin structure, a gate structure and a source/drain structure. The isolation insulating layer is disposed over a substrate. The first fin structure and the second fin structure are both disposed over the substrate, and extend in a first direction in plan view. The gate structure is disposed over parts of the first and second fin structures, and extends in a second direction crossing the first direction in plan view. A first void formed in the source/drain structure, and a second void formed in the source/drain structure and located above the first void.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
   forming a first fin structure and a second fin structure over a substrate, the first and second fin structures extending in a first direction in plan view;
   forming an isolation insulating layer over the substrate so that lower portions of the first and second fin structures are embedded in the isolation insulating layer and upper portions of the first and second fin structures are exposed from the isolation insulating layer;
   forming a gate structure over parts of the first and second fin structures, the gate structure including a gate pattern, a dielectric layer disposed between the gate pattern and the first and second fin structures, a cap insulating layer disposed over the gate pattern, the gate structure extending in a second direction crossing the first direction in plan view;
   recessing upper portions of the first and second fin structures to a level equal to or below an upper surface of the isolation insulating layer;
   forming a first epitaxial layer over the recessed first and second fin structures; and
   forming a second epitaxial layer over the first epitaxial layer, thereby forming an epitaxial source/drain structure, wherein:
   in forming the first epitaxial layer, a V-shape structure is formed at an area corresponding to an area between the first and second fin structures that have been recessed, and
   a first void is formed by the second epitaxial layer at a bottom of the V-shape.

2. The method of claim 1, wherein the first void is formed between the first epitaxial layer and the second epitaxial layer.

3. The method of claim 1, wherein a second void is formed in the second epitaxial layer above the first void.

4. The method of claim 3, wherein a third void is formed in the second epitaxial layer above the second void.

5. The method of claim 1, wherein:
the first epitaxial layer includes SiP, and the second epitaxial layer includes SiP, and
an amount of P in the second epitaxial layer is greater than an amount of P in the first epitaxial layer.

6. The method of claim 1, wherein:
in the recessing the first and second fin structures, the isolation insulating layer between the first and second fin structures are removed, and
the first and second fin structures are recessed to bottoms of the first and second fin structures so that a recessed portion of the first and second fin structures have a flat surface.

7. The method of claim 1, further comprising, after the epitaxial source/drain structure is formed:
forming a silicide layer on the epitaxial source/drain structure;
forming an interlayer insulating layer;
forming an opening in the interlayer insulating layer; and
forming a conductive material over the silicide layer in the opening.

8. The method of claim 7, wherein
after the opening is formed in the interlayer insulating layer, the silicide layer is formed on the epitaxial source/drain structure.

9. A method of manufacturing a semiconductor device including a Fin FET, the method comprising:
forming a first fin structure and a second fin structure over a substrate, the first and second fin structures extending in a first direction in plan view,
forming an isolation insulating layer over the substrate so that lower portions of the first and second fin structures are embedded in the isolation insulating layer and upper portions of the first and second fin structures are exposed from the isolation insulating layer;
forming a gate structure over parts of the first and second fin structures, the gate structure including a gate pattern, a dielectric layer disposed between the gate pattern and the first and second fin structures, a cap insulating layer disposed over the gate pattern, the gate structure extending in a second direction crossing the first direction in plan view;
recessing upper portions of the first and second fin structures to a level equal to or below an upper surface of the isolation insulating layer;
forming a first epitaxial layer over the recessed first and second fin structures;
forming a second epitaxial layer over the first epitaxial layer; and
forming a third epitaxial layer over the second epitaxial layer, thereby forming an epitaxial source/drain structure, wherein:
in forming the first epitaxial layer, a first V-shape structure is formed at an area corresponding to an area between the first and second fin structures that have been recessed,
a first void is formed by the second epitaxial layer at a bottom of the first V-shape,
in forming the second epitaxial layer, a second V-shape structure is formed over the first V-shape, and
a second void is formed by the third epitaxial layer at a bottom of the second V-shape.

10. The method of claim 9, wherein the first void is formed between the first epitaxial layer and the second epitaxial layer.

11. The method of claim 9, wherein the second void is formed between the second epitaxial layer and the third epitaxial layer.

12. The method of claim 11, wherein a third void is formed in the third epitaxial layer above the second void.

13. The method of claim 9, wherein:
the first epitaxial layer includes SiP, and the second epitaxial layer includes SiP, and
an amount of P in the second epitaxial layer is greater than an amount of P in the first epitaxial layer.

14. The method of claim 13, wherein:
the third epitaxial layer includes SiP, and
an amount of P in the third epitaxial layer is equal to or greater than the amount of P in the second epitaxial layer.

15. The method of claim 9, wherein:
in the recessing the first and second fin structures, the isolation insulating layer between the first and second fin structures are removed, and
the first and second fin structures are recessed to bottoms of the first and second fin structures so that a recessed portion of the first and second fin structures have a flat surface.

16. A semiconductor device comprising:
an isolation insulating layer disposed over a substrate;
a first fin structure and a second fin structure, both disposed over the substrate, the first and second fin structures extending in a first direction in plan view;
a gate structure disposed over parts of the first and second fin structures, the gate structure extending in a second direction crossing the first direction in plan view;
a source/drain structure;
a first void formed in the source/drain structure; and
a second void formed in the source/drain structure and located above the first void.

17. The semiconductor device of claim 16, wherein:
multiple first voids are formed in the source/drain structure, and
the multiple first voids are located at substantially the same height in the source/drain structure.

18. The semiconductor device of claim 16, wherein:
multiple second voids are formed in the source/drain structure, and
the multiple second voids are located at substantially the same height in the source/drain structure.

19. The semiconductor device of claim 16, wherein:
the source/drain structure includes a first epitaxial layer and a second epitaxial layer disposed on the first epitaxial layer,
the first epitaxial layer has a first V-shape, and
the first void is formed by the second epitaxial layer at a bottom of the first V-shape.

20. The semiconductor device of claim 19, wherein:
the source/drain structure further includes a third epitaxial layer disposed on the second epitaxial layer,
the second epitaxial layer has a second V-shape, and
the second void is formed by the third epitaxial layer at a bottom of the second V-shape.

* * * * *